United States Patent
Kajita et al.

(10) Patent No.: US 11,817,398 B2
(45) Date of Patent: Nov. 14, 2023

(54) CONDUCTIVE PASTE

(71) Applicant: NAMICS CORPORATION, Niigata (JP)

(72) Inventors: Masashi Kajita, Niigata (JP); Masahiro Kitamura, Niigata (JP); Takayuki Higuchi, Niigata (JP); Noritsuka Mizumura, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

(21) Appl. No.: 17/280,256

(22) PCT Filed: Sep. 24, 2019

(86) PCT No.: PCT/JP2019/037179
§ 371 (c)(1),
(2) Date: Mar. 26, 2021

(87) PCT Pub. No.: WO2020/066968
PCT Pub. Date: Apr. 2, 2020

(65) Prior Publication Data
US 2022/0045026 A1   Feb. 10, 2022

(30) Foreign Application Priority Data
Sep. 28, 2018   (JP) ................................ 2018-183879

(51) Int. Cl.
*H01L 23/00* (2006.01)
*B22F 1/107* (2022.01)
*B22F 1/054* (2022.01)
*B22F 1/052* (2022.01)

(52) U.S. Cl.
CPC ............ *H01L 23/562* (2013.01); *B22F 1/052* (2022.01); *B22F 1/054* (2022.01); *B22F 1/056* (2022.01); *B22F 1/107* (2022.01); *H01L 24/29* (2013.01); *H01L 2224/29247* (2013.01); *H01L 2924/15747* (2013.01); *H01L 2924/3512* (2013.01)

(58) Field of Classification Search
CPC .......... H01L 24/29; H01L 2224/29247; H01L 2924/15747; H01L 2924/3512
See application file for complete search history.

(56) References Cited

U.S. PATENT DOCUMENTS

| 10,930,612 | B2 | 2/2021 | Nakako et al. | |
|---|---|---|---|---|
| 2015/0136219 | A1* | 5/2015 | Koike | H05K 1/092 |
| | | | | 252/512 |
| 2016/0057866 | A1* | 2/2016 | Shimoda | C09D 11/38 |
| | | | | 257/532 |
| 2016/0338201 | A1 | 11/2016 | Kiyono et al. | |
| 2017/0140847 | A1 | 5/2017 | Kamikooriyama et al. | |
| 2017/0213788 | A1* | 7/2017 | Shimanuki | H01L 24/48 |
| 2017/0252801 | A1 | 9/2017 | Ida et al. | |
| 2021/0143121 | A1 | 5/2021 | Nakako et al. | |

FOREIGN PATENT DOCUMENTS

| CN | 106663880 B | * | 5/2017 | |
|---|---|---|---|---|
| CN | 106663880 B | * | 7/2019 | ............... C08K 3/08 |
| JP | H10021744 A | | 1/1998 | |
| JP | 2006183072 A | | 7/2006 | |
| JP | 2013028859 A | | 2/2013 | |
| JP | 2014167145 A | | 9/2014 | |
| JP | 2017041645 A | | 2/2017 | |
| JP | WO2018216597 A1 | * | 5/2018 | |
| WO | 2016031860 A1 | | 3/2016 | |
| WO | 2018131095 A1 | | 7/2018 | |
| WO | WO-2018216597 A1 | * | 11/2018 | ............. H01L 24/29 |

OTHER PUBLICATIONS

International Search Report (ISR) (and English translation thereof) dated Dec. 17, 2019 issued in International Application No. PCT/JP2019/037179.
Written Opinion dated Dec. 17, 2019 issued in International Application No. PCT/JP2019/037179.
Chinese Office Action dated May 5, 2022, issued in counterpart Chinese Application No. 201980062109.9.
Supplementary European Search Report dated Jun. 2, 2022 issued in European Application No. 19865615.9.

* cited by examiner

*Primary Examiner* — Mohammad M Choudhry
(74) *Attorney, Agent, or Firm* — Holtz, Holtz & Volek PC

(57) ABSTRACT

A conductive paste contains (A) copper fine particles having an average particle diameter of 50 nm to 400 nm and a crystallite diameter of 20 nm to 50 nm, (B) copper particles having an average particle diameter of 0.8 μm to 5 μm and a ratio of a crystallite diameter to the crystallite diameter of the copper fine particles (A) of 1.0 to 2.0, and (C) a solvent.

9 Claims, No Drawings

CONDUCTIVE PASTE

TECHNICAL FIELD

The present invention relates to a conductive paste, a die attach agent, and a semiconductor device fabricated using the die attach agent.

BACKGROUND ART

In the manufacture of semiconductor devices, conductive adhesives such as die attach agents are used to adhere and fix semiconductor elements such as semiconductor chips to support members for mounting semiconductor elements (e.g., metal plates such as lead frames). The metallic particles used in conductive adhesives include silver (Ag), gold (Au), copper (Cu), nickel (Ni), palladium (Pd), tin (Sn), and their alloys, as well as inorganic fillers coated with gold, silver, or palladium.

Patent Document 1 discloses a bonding material using an inexpensive copper nanoparticle paste without using silver, which causes electrochemical migration, as the main component. Patent Document 1 further discloses that copper microparticles and the like are mixed with copper nanoparticles to improve bonding properties, and that by focusing on the bonding atmosphere, high bonding strength is achieved in low-temperature sintering without pressure.

PRIOR ART DOCUMENTS

Patent Documents

Patent Document 1: JP 2014-167145

SUMMARY OF THE INVENTION

Problems to be Solved by the Invention

However, it was found that when copper nanoparticles and copper microparticles are used together in conductive pastes, the specific resistance of the conductive body obtained after firing may become high or the adhesion strength (die shear strength) may become low. When a conductive paste is used as a conductive adhesive such as a die attach agent, a conductive paste with low resistance and high adhesion strength (die shear strength) is required.

The present invention addresses the problem of providing a conductive paste that achieves both low resistance and high adhesive strength (die shear strength).

Means to Solve the Problems

Specific measures to solve the aforementioned problems are as follows.

The first embodiment of the present invention is a conductive paste containing
  (A) copper fine particles having an average particle diameter of 50 nm to 400 nm and a crystallite diameter of 20 nm to 50 nm,
  (B) copper particles having an average particle diameter of 0.8 μm to 5 μm, and a ratio of a crystallite diameter to the crystallite diameter of the (A) copper fine particles of 1.0 to 2.0, and
  (C) a solvent.

A second embodiment of the present invention is a die attach agent containing the conductive paste of the first embodiment.

A third embodiment of the present invention is a semiconductor device fabricated using the die attach agent of the second embodiment.

Effects of the Invention

According to the present invention, it is possible to provide a conductive paste and a die attach agent that achieve both low resistance and high adhesion strength (die shear strength) without cracking in the resulting conductive body after firing (improvement of crack resistance). Also, the present invention can provide a semiconductor device containing a conductive body that achieves both low resistance and high adhesion strength (die shear strength).

EMBODIMENTS TO CARRY OUT THE INVENTION

[Conductive Paste]

The conductive paste, which is the first embodiment of the present invention, contains (A) copper fine particles having an average particle diameter of 50 nm to 400 nm and a crystallite diameter of 20 nm to 50 nm, (B) copper particles having an average particle diameter of 0.8 μm to 5 μm and a ratio of a crystallite diameter to the crystallite diameter of the (A) copper fine particles of 1.0 to 2.0, and (C) a solvent. Although the mechanism is not clear, by using the (A) copper fine particles and the (B) copper particles together and by setting the ratio of the crystallite diameter the (B) copper particles to that of the (A) copper fine particles to a specific value, it is possible to achieve both low resistance and high adhesion strength (die shear strength) without cracking in the resulting conductive body (improved crack resistance).

In the present description, the (A) copper fine particles and the (B) copper particles may be used in the state of primary particles, secondary particles, or a mixture of primary and secondary particles. When used in the state of primary particles, the average particle diameter can be measured as an average value of the diameters of 200 primary particles observed with a scanning electron microscope (SEM) (number average value). The average particle diameter when used in the state of secondary particles can be measured as an average value of the diameters of 200 secondary particles observed with a scanning electron microscope (SEM) (number average value). The average particle diameter in the case of mixed primary and secondary particles can be measured as an average value of the diameters of the particles (number average value) when a total of 200 primary and secondary particles are observed with a scanning electron microscope (SEM). The magnification of the SEM can be selected as appropriate to observe the (A) copper fine particles and the (B) copper particles when this observation is made by SEM. Usually, a magnification of 3000 to 5000× is used. Primary and secondary particles are based on the definitions given in JIS H7008 (ultrafine metal particles).

In the present description, the crystallite diameter refers to a result obtained by the measurement by a powder X-ray diffraction method using CuKα ray as a line source to obtain a full width at half maximum of the peak of Miller index (111) plane, and the calculation using Scherrer's equation.

In the present description, the aspect ratio refers to an average value of the ratio of the long diameter to the short diameter of a particle when 50 particles are observed with a scanning electron microscope (SEM). When the particles are in the form of flat plates, such as plates and scales (flakes), the aspect ratio refers to an average value of the ratio of the long diameter to the thickness of the particles.

(A) Copper Fine Particles

The conductive paste of the present invention contains (A) copper fine particles having an average particle diameter of 50 nm to 400 nm and a crystallite diameter of 20 nm to 50 nm.

The (A) copper fine particles of the present invention have an average particle diameter of 50 nm to 400 nm, preferably 70 nm or more, more preferably 80 nm or more, even more preferably 100 nm or more, and particularly preferably 110 nm or more, while preferably 350 nm or less, more preferably 320 nm or less, and even more preferably 300 nm or less. When the average particle diameter of the (A) copper fine particles is within the range set by these upper and lower limits, significant oxidation of the surface is prevented and sintering at low temperatures becomes possible.

The (A) copper fine particles of the present invention have a crystallite diameter of 20 nm to 50 nm, preferably 25 nm or more, while preferably 45 nm or less, more preferably 40 nm or less. When the crystallite diameter is within the range set by these upper and lower limits, the oxidation resistance is superior to that of crystallite diameters smaller than these limits, resulting in superior sinterability.

The shape of the (A) copper fine particles of the present invention is not particularly limited, and can be, for example, spherical, roughly spherical, lumpy, needle-like, or flake-like, preferably spherical or roughly spherical, more preferably with an aspect ratio of 1.0 to 4.0, and even more preferably with an aspect ratio of 1.0 to 2.0. When the aspect ratio of the (A) copper fine particles is in this range, the contact between the (A) copper fine particles and the (B) copper particles increases, resulting in excellent sinterability and low resistance.

The (A) copper fine particles of the present invention can be produced, for example, by mixing a copper salt of a carboxylic acid with an aliphatic primary amine, followed by the addition of a reducing agent to precipitate copper fine particles at a reaction temperature of 5° C. to 80° C.

More specifically, a copper salt of a carboxylic acid is mixed with an aliphatic primary amine to obtain a solution in which the copper salt of the carboxylic acid is dissolved. In the solution, the aliphatic primary amine is coordinated to the copper salt of the carboxylic acid, and is thought to form a kind of amine complex.

The copper salt of a carboxylic acid may be a copper salt of either an aliphatic or aromatic carboxylic acid. The copper salt of a carboxylic acid may also be a copper salt of a monocarboxylic acid or polycarboxylic acid such as a dicarboxylic acid. The copper salt of an aliphatic carboxylic acid may be a copper salt of a chain aliphatic carboxylic acid or a copper salt of a cyclic aliphatic carboxylic acid. The copper salt of a carboxylic acid used in the present invention is preferably a copper salt of a chain aliphatic monocarboxylic acid, more preferably copper formate, copper acetate, copper propionate or copper butyrate, and particularly copper formate. These copper salts of carboxylic acids can be used alone or in combination with two or more others.

The aliphatic primary amine may be a chain aliphatic primary amine or a cyclic aliphatic primary amine. The aliphatic primary amine may also be a monoamine compound or a polyamine compound such as a diamine compound. The aliphatic primary amine includes those in which the aliphatic hydrocarbon group is substituted with an alkoxy group, such as a hydroxyl group, a methoxy group, an ethoxy group, or a propyloxy group. The aliphatic primary amine used in the present invention is preferably 3-methoxypropylamine, 3-aminopropanol and 1,2-diaminocyclohexane, more preferably 3-methoxypropylamine. These aliphatic primary amines can be used alone or in combination with two or more others.

The amount of aliphatic primary amine used is determined by the process requirements and equipment, such as a post-treatment of the copper fine particles to be produced, and from the viewpoint of obtaining copper fine particles with a controlled particle diameter, it is preferable to use 1 or more equivalents of aliphatic primary amine per equivalent of the copper salt of the carboxylic acid. The amount of aliphatic primary amine used is preferably 1.0 to 4.0 equivalents per equivalent of the copper salt of the carboxylic acid.

Mixing of the copper salt of the carboxylic acid with the aliphatic primary amine can be performed in the absence or presence of an organic solvent. The use of an organic solvent can facilitate the mixing. The organic solvent includes alcohols such as ethanol, propanol, and butanol, ethers such as propylene glycol dibutyl ether, and aromatic hydrocarbons such as toluene. These organic solvents can be used alone or in combination of two or more types. The amount of organic solvent used can be an arbitrary amount in terms of convenience of mixing and productivity of copper fine particles in the subsequent process.

Mixing of the copper salt of carboxylic acid with the aliphatic primary amine is performed, for example, by adding the copper salt of carboxylic acid to the primary aliphatic amine or a mixture of the primary aliphatic amines and an organic solvent while stirring. After the addition is completed, stirring can be continued as appropriate. During this process, the temperature is preferably maintained at 20° C. to 80° C., more preferably at 20° C. to 60° C.

Then, a reducing agent is added to precipitate the copper fine particles. As the reducing agent, formic acid, formaldehyde, ascorbic acid or hydrazine is preferable in terms of controlling the reaction, and hydrazine is more preferable. These reducing agents can be used alone or in combination with two or more others.

The amount of reducing agent used is usually more than the redox equivalent to the copper salt of the carboxylic acid, and the redox equivalent is preferably 1 to 5 times the redox equivalent, and more preferably 1 to 3 times the redox equivalent. When the copper salt of the carboxylic acid is a copper salt of a dicarboxylic acid and hydrazine is used as the reducing agent, the amount of hydrazine used in molar equivalent is preferably 0.5 mol to 1.5 mol, more preferably 0.75 mol to 1.25 mol, and even more preferably 0.9 mol to 1.1 mol for 1 mol of the copper salt of the dicarboxylic acid.

In the addition of the reducing agent and the subsequent reaction, the temperature is maintained at 5° C. to 80° C. The temperature is preferably 5° C. to 70° C., and more preferably 5° C. to 60° C. When the temperature is in this range, the grain growth of copper fine particles is sufficient, productivity is high, and secondary agglomeration is suppressed. The time required for the addition of the reducing agent and the subsequent reaction depends on the scale of the reaction system, and usually ranges from 10 minutes to 10 hours. During the addition of the reducing agent and the subsequent reaction, an additional organic solvent such as alcohols such as ethanol, propanol and butanol, ethers such as propylene glycol dibutyl ether, and aromatic hydrocarbons such as toluene can be added as necessary.

In the addition of the reducing agent and the subsequent reaction, the amount (mol) of the copper salt of the carboxylic acid to the total volume (L) of the solution of the copper salt of the carboxylic acid mixed with the aliphatic primary amine, the reducing agent, and the optional organic solvent is preferably in the range of 1.0 mol/L to 6.0 mol/L, more preferably 2.0 mol/L to 5.0 mol/L, and even more preferably 2.0 mol/L to 4.0 mol/L. When the concentration is in this range, the reaction solution can be stirred sufficiently to remove the reaction heat, which results in an appropriate average particle diameter of the precipitated copper fine particles, which in turn does not interfere with operations such as sedimentation decanting and solvent replacement in subsequent processes.

The copper fine particles precipitated by the reaction can be allowed to settle and the supernatant can be removed by decantation or other means, or can be separated by adding a solvent such as methanol, ethanol, terpineol, or other alcohol. The layer containing the copper fine particles can be used as is as a conductive paste. When settling the (A) copper fine particles, alcohols such as methanol and ethanol can be added to the layer containing the (A) copper fine particles to speed up the settling of the (A) copper fine particles. The layer containing the (A) copper fine particles can also be evaporated with an evaporator to remove the remaining solvent if necessary to increase the copper content in the layer. When the layer containing the (A) copper fine particles precipitated by the reaction is used as a conductive paste, the (C) solvent described below can also be added to the layer containing the (A) copper fine particles just before the solvent contained in the layer is removed by an evaporator in order to adjust the viscosity of the paste.

Amines, such as aliphatic primary amines, are thought to exist around the (A) copper fine particles. The amines present around the copper fine particles are thought to prevent the aggregation of the copper fine particles.

The content of the (A) copper fine particles is preferably 20 parts by mass or more, more preferably 25 parts by mass or more, and even more preferably 30 parts by mass or more, while preferably 80 parts by mass or less, more preferably 70 parts by mass or less, even more preferably 60 parts by mass or less, and particularly preferably 55 parts by mass or less based on the total 100 parts by mass of the (A) copper fine particles and the (B) copper particles. Such a lower limit is desirable from the viewpoint of low resistance. Such an upper limit is also preferable from the viewpoint of crack resistance. When the content of the (A) copper fine particles is within the range set by these upper and lower limits, the sinterability of the (A) copper fine particles and the (B) copper particles is controlled, which is preferable because both low-temperature sinterability and crack resistance can be achieved.

When the (A) copper fine particles and the (B) copper particles are contained in the conductive paste, the method for measuring the crystallite diameters of the (A) copper fine particles and the (B) copper particles can be by diluting the conductive paste with excess solvent (which may be the same or different from the (C) solvent below) and then separating the (A) copper fine particles and the (B) copper particles from the conductive paste using gravity, centrifugal force, filtering, etc. After this separation, the solvent can be removed and the crystallite diameters of the (A) copper fine particles and the (B) copper particles can be measured. After separation and solvent removal in a similar manner, the particle diameters of the (A) copper fine particles and the (B) copper particles may be measured.

(B) Copper Particles

The conductive paste of the present invention contains (B) copper particles. The (B) copper particles have an average particle diameter of 0.8 μm to 5 μm, and a ratio of a crystallite diameter to the crystallite diameter of the (A) copper fine particles of 1.0 to 2.0.

The (B) copper particles of the present invention have an average particle diameter of 0.8 μm to 5 μm, preferably 0.85 μm or more, more preferably 0.9 μm or more, while preferably 4.5 μm or less, more preferably 4 μm or less. When the average particle diameter of the (B) copper particles is in the range set by these upper and lower limits, the sinterability can be controlled, and both low-temperature sinterability and crack resistance can be achieved.

The (B) copper particles of the present invention have a ratio of a crystallite diameter to the crystallite diameter of the (A) copper fine particles of 1.0 to 2.0, preferably 1.2 or more, more preferably 1.3 or more, even more preferably 1.4 or more, and particularly preferably 1.5 or more, while preferably 1.9 or less, more preferably 1.8 or less. If the ratio of the crystallite diameters is within the range set by these upper and lower limits, both low resistance and high adhesion strength (die shear strength) can be achieved. For example, if the (B) copper particles are produced by a water atomization method, the desired crystallite diameter can be obtained by increasing the particle diameter to slow down the crystal growth rate.

The shape of the (B) copper particles of the present invention is not particularly limited, and can be, for example, spherical, roughly spherical, lumpy, needle-like, or flake-like, preferably spherical or roughly spherical, and the aspect ratio is usually 1.0 to 4.0, preferably 1.0 to 2.0. When the aspect ratio is in this range, the contact between the (B) copper particles or the (A) copper fine particles increases, resulting in excellent sinterability and low resistance.

As the (B) copper particles of the present invention, commercially available copper particles can be used. Examples of the commercially available copper particles include EFC-09 (manufactured by Fukuda Metal Foil & Powder Co., Ltd.), CS-10D (manufactured by Mitsui Mining & Smelting Co., Ltd.), HXR-Cu (manufactured by Nippon Atomized Metal Powders Corporation), DCX-99 (manufactured by DOWA Electronics Materials Co., Ltd.) and DCX-160 (manufactured by DOWA Electronics Materials Co., Ltd.).

The content of the (B) copper particles is preferably 20 parts by mass to 80 parts by mass based on the total 100 parts by mass of the (A) copper fine particles and the (B) copper particles. The content of the (B) copper particles is preferably 20 parts by mass or more, more preferably 30 parts by mass or more, even more preferably 40 parts by mass or more, and particularly preferably 45 parts by mass or more, while preferably 80 parts by mass or less, more preferably 75 parts by mass or less, and even more preferably 70 parts by mass or less. When the content of the (B) copper particles is in the range set by these upper and lower limits, this is preferable because the sinterability of the (A) copper fine particles and the (B) copper particles can be controlled, and both low-temperature sintering and crack resistance can be achieved. From the viewpoint of low resistance and handling, the total content of the (A) copper fine particles and the (B) copper particles is usually 80 parts by mass or more, preferably 82 parts by mass or more, more preferably 84 parts by mass or more, while usually 96 parts by mass or less, preferably 94 parts by mass or less, more preferably 92 parts by mass or less, when the weight of the entire conductive paste is 100 parts by mass.

In the present invention, copper particles having a particle diameter or average particle diameter other than the (A) copper fine particles and the (B) copper particles may be included to the extent that they do not interfere with the purpose of the present invention. For example, even if a group of copper particles with other average particle diameter or particle diameter is included in addition to the (A) copper fine particles and the (B) copper particles, such an aspect is not excluded from the invention as long as the purpose of the invention is not hindered.

(C) Solvent

The conductive paste of the present invention contains (C) a solvent. The (C) solvent can be included to adjust the viscosity of the conductive paste, which evaporates or vaporizes during the firing of the conductive paste.

Examples of the (C) solvent include alcohols such as methanol, ethanol and isopropyl alcohol (IPA), organic acids such as ethylene acetate, aromatic hydrocarbons such as toluene and xylene, N-alkylpyrrolidones such as N-methyl-2-pyrrolidone (NMP), amides such as N,N-dimethylformamide (DMF), ketones such as methyl ethyl ketone (MEK), terpineol (TEL), dihydroterpineol (DTEL), 2-ethyl-1,3-hexanediol (2EHD), texanol (TEX), butylcarbitol (BC), butylcarbitol acetate (BCA), dipropylene glycol, etc. These solvents may be used alone or in combination of two or more types.

The content of the (C) solvent is not particularly limited, and is preferably 1 part by mass to 100 parts by mass, and more preferably 3 parts by mass to 60 parts by mass based on the total 100 parts by mass of the (A) copper fine particles and the (B) copper particles.

(D) Amine Compound

The conductive paste of the present invention can preferably contain (D) an amine compound. The inclusion of the (D) amine compound can prevent the aggregation of the (A) copper fine particles.

As the (D) amine compound, an amine compound represented by formula: $NHR_1R_4$ (wherein $R_1$ represents a linear or branched alkyl group with 2-4 carbons substituted with one substituent selected from the group consisting of a hydroxyl group, a methoxy group, an ethoxy group and an amino group, and $R_4$ represents hydrogen or an alkyl group with 1-3 carbon atoms that may be substituted with an amino group) is preferred. An amine compound represented by formula: $NH_2R_5$ (wherein $R_5$ represents a linear or branched alkyl group with 2-4 carbon atoms substituted with one substituent selected from the group consisting of a hydroxyl group, a methoxy group and an ethoxy group) is more preferred.

Specific examples of the amine compound include: compounds containing a primary amino group such as 3-methoxypropylamine, 3-ethoxypropylamine, 1-amino-2-propanol, 3-amino-1-propanol, 2-aminoethanol, 2-amino-2-methyl-1-propanol, N-methyl-1,3-diaminopropane, 3,3'-diaminodipropylamine, 2-methoxyethylamine, 1,3-diaminopropane and 2-(2-aminoethylamino)ethanol; compounds containing a secondary amino group such as N-methylethanolamine and 2,2'-iminodiethanol; or compounds containing a tertiary amino group such as 2-dimethylaminoethanol. Of these, 3-methoxypropylamine is preferred.

The amine compound in the conductive paste of the present invention also includes the aliphatic primary amine that was used in the production of the (A) copper fine particles, existed around the (A) copper fine particles and then have migrated into the conductive paste.

The (D) amine compound can be included in an amount of 1 part by mass to 40 parts by mass, preferably 1 part by mass to 18 parts by mass, more preferably 1 part by mass to 15 parts by mass, and particularly preferably 1 part by mass to 12 parts by mass, based on 100 parts by mass of the (A) copper fine particles. By setting the content of the (D) amine compound in this range, the aggregation of the (A) copper fine particles can be prevented. The (D) amine compound can be included in an amount of 0.2 parts by mass to 10 parts by mass, preferably 0.2 parts by mass to 8 parts by mass, more preferably 0.2 parts by mass to 6 parts by mass, and particularly preferably 0.2 parts by mass to 4 parts by mass based on 100 parts by mass of the conductive paste.

The (D) amine compound may be one type or a combination of two or more types. The (D) amine compound can be analyzed using mass spectrometer, NMR, or any other desired device or method.

(E) Metal Particles Other than Copper

The conductive paste of the present invention may further contain metal particles other than copper as long as the effect of the present invention is not impaired. The (E) metal particles other than copper include silver (Ag), nickel (Ni), palladium (Pd), gold (Au), platinum (Pt), and their alloys.

(F) Other Components

The conductive paste of the present invention may contain other additives, such as a dispersant, a rheology modifier, and a pigment.

The conductive paste of the present invention may also contain a plasticizer (e.g., copolymers such as carboxyl group-terminated polybutadiene-acrylonitrile, resin powders such as silicone rubber, silicone rubber powder, silicone resin powder, acrylic resin powder, etc.), a defoamer, etc.

The viscosity of the conductive paste of the present invention is usually 10 to 300 Pa·s, preferably 20 to 100 Pa·s. The viscosity is measured using an E-type viscometer (3° cone) manufactured by Tokyo Keiki Inc. at 5 rpm while maintaining the temperature of the sample at 25±1° C. By adjusting the viscosity of the conductive paste to this range, the conductive paste becomes easier to apply to the metal plate and easier to handle.

The conductive paste of the present invention can be manufactured by mixing each of the above components using, for example, a Rycai machine, pot mill, three-roll mill, rotary mixer, biaxial mixer, etc. The manufacturing temperature is not particularly limited, and can be manufactured at room temperature, for example.

The conductive paste of the present invention is applied to a substrate or the like, and the temperature is raised from room temperature to 200 to 300° C. under a non-oxidizing atmosphere, and held at 200 to 300° C. for 5 to 20 minutes to volatilize the (C) solvent and organic matter on the surface of the (A) copper fine particles, and to sinter the (A) copper fine particles and the (B) copper particles to each other to obtain a conductive body. Examples of the non-oxidizing atmospheres include neutral or weakly reducing atmospheres such as nitrogen gas, nitrogen-hydrogen mixed gas (e.g., hydrogen concentration of about 3-5%), argon gas, etc. The temperature rise rate is preferably 5° C./min to 100° C./min, and more preferably 10° C./min to 30° C./min, from the viewpoint of forming a densely sintered conductive body. The sintering temperature is preferably 200 to 300° C., and more preferably 220 to 280° C. In terms of the uniformity of the sintering of the conductive body, it is preferable to bold the conductive body at the sintering temperature for 5 to 20 minutes.

The conductive paste of the present invention can be suitably used as a conductive adhesive for the base of plating, electrode, die attach agent, etc. The conductive paste of the present invention is highly useful when the support member is a base metal such as copper, for example, when it is a copper lead frame or copper substrate, as it can further demonstrate the effect of high adhesive strength (die shear strength).

[Die Attach Agent]

The die attach agent, which is the second embodiment of the present invention, contains the conductive paste of the first embodiment above. When the conductive paste of the present invention is used as a die attach agent, it can be applied to a lead frame or a substrate, etc., and a semiconductor element, a heat radiation member or the like can be mounted and bonded by heat treatment.

[Semiconductor Device]

The semiconductor device, which is the third embodiment of the present invention, is fabricated using the die attach agent of the second embodiment above, and contains a conductive body obtained by heat-treating the die attach agent. The die attach agent of the second embodiment can be applied to a lead frame, substrate, or the like, and a semiconductor device, heat radiation member, or the like can be mounted and bonded by heat treatment. As for the conditions of heat treatment, the conditions described in the section on conductive paste, the first embodiment above, can be applied. Then, after wire bonding, the semiconductor device can be obtained by encapsulation. This semiconductor device can be solder mounted on a printed circuit board to be used as various electronic components. In this embodiment, it is preferable that the surface to which the die attach agent is applied is copper, because it can further demonstrate the effect of high adhesion strength (die shear strength).

EXAMPLES

The invention will be described in more detail by means of examples and comparative examples, but the invention is not limited to these examples.

[Preparation of Conductive Paste]

Each conductive paste was prepared by mixing the following components in the proportions of Examples 1 to 4 and Comparative Examples 1 and 2 listed in Table 1. The proportions of each component shown in Table 1 are all in parts by mass, and a blank column means that the component is not blended.

(A) Copper Fine Particles

When 400 g (4.5 mol) of 3-methoxypropylamine was added to the reaction vessel and 450 g (2.0 mol) of copper formate was added while maintaining the reaction temperature below 40° C. with stirring, the copper formate dissolved into a dark blue solution. When 100 g (2.0 mol) of hydrazine was slowly added to the solution, and the reaction temperature was maintained at 5-60° C., copper fine particles were formed with the addition of hydrazine, and the dark blue solution gradually changed to dark brown. After the reaction was terminated by dropping the entire amount of hydrazine, methanol was added to the resulting reaction mixture with stirring, and the mixture was then separated into two layers when left to stand at 25° C. The upper layer was a pale yellow clear liquid, and brownish (A) copper fine particles settled in the lower layer. The liquid in the upper layer was removed by decantation, and then methanol addition, standing, and decantation were repeated to obtain a paste. To the resulting paste, 10 g of 2-ethyl-1,3-hexanediol was added and mixed, and the remaining methanol was removed by evaporator to obtain a copper particles slurry containing the (A) copper fine particles with a copper content of 90% by mass. The amount of the (A) copper fine particles shown in Table 1 is the amount of copper component. Of the remaining 10% by mass of the copper particles slurry, 2% by mass is 3-methoxypropylamine and 8% by mass is 2-ethyl-1,3-hexanediol. This was confirmed by using a thermogravimetric differential thermal analysis (TG/DTA) system.

(B) Copper Particles 1

EFC-09 (manufactured by Fukuda Metal Foil & Powder Co., Ltd.)

(B) Copper Particles 2

CS-10D (manufactured by Mitsui Mining & Smelting Co., Ltd.)

(B) Copper Particles 3

HXR-Cu (manufactured by Nippon Atomized Metal Powders Corporation)

(B) Copper Particles 4

DCX-99 (manufactured by DOWA Electronics Materials Co., Ltd.)

(C) Solvent

2-Ethyl-1,3-hexanediol (manufactured by FUJIFILM Wako Pure Chemical Corporation)

Table 1 shows the total amount of 2-ethyl-1,3-hexanediol contained in the copper particles slurry including the (A) copper fine particles with a copper content of 90% by mass, and 2-ethyl-1,3-hexanediol added separately if a solvent is required.

(D) Amine Compound

3-Methoxypropylamine (Tokyo Chemical Industry Co., Ltd.)

Table 1 shows the amount of 3-methoxypropylamine contained in a copper particles slurry including the (A) copper fine particles with a copper content of 90% by mass.

The measurement methods in Examples and Comparative Examples are as follows.

[Average Particle Diameter]

The average particle diameter is an average value of the diameters of 200 arbitrary particles observed with a scanning electron microscope (SEM) (number average value). The scanning electron microscope (SEM) used was an S-3400N (manufactured by Hitachi High-Tech Corporation).

[Crystallite Diameter]

The crystallite diameter was obtained by the measurement by a powder X-ray diffraction method using CuKα ray as a line source to obtain full width at half maximum of the peak of Miller index (111) plane, and the calculation using Scherrer's equation. The Scherrer constant used was 1.33. An Ultima IV X-ray diffractometer (Rigaku Corporation) was used as the X-ray diffractometer.

[Measurement of Crack Occurrence]

The conductive paste of each of Examples and Comparative Examples was applied to a glass substrate in the shape of 5 mm in width, 50 mm in length, and 0.05 mm in thickness, and the temperature was raised from room temperature (25° C.) to 250° C. at a rate of 10° C./minute, and then fired by holding at 250° C. for 20 minutes to form a conductive body. The presence or absence of cracks in the conductive body (presence or absence of shrinkage in the thin film) were observed visually.

Not occurred: The number of cracks in the conductive body is 0.

Occurred: The number of cracks in the conductive body is 1 or more.

[Measurement of Specific Resistance]

The test piece prepared in the crack occurrence measurement above was used for the measurement of specific resistance. Using an LCR meter, the specific resistance (resistivity) was measured using the four-terminal method.

[Die Shear Strength]

A 1 mm×1 mm gold-coated silicon chip was mounted on a copper lead frame using the conductive paste of each of Examples and Comparative Examples. Under a non-oxidizing atmosphere (nitrogen-hydrogen mixed gas (hydrogen concentration of about 3-5%)), the temperature was raised from room temperature (25° C.) to 250° C. at a rate of 10° C./min and held at 250° C. for 20 minutes. After firing, the die shear strength was measured at room temperature (25° C.) using a bond tester. The bond tester was a 4000 universal bond tester (manufactured by Nordson DAGE).

TABLE 1

| | | Average particle diameter (μm) | Crystallite diameter (nm) | Example 1 | Example 2 | Example 3 | Example 4 | Comparative Example 1 | Comparative Example 2 |
|---|---|---|---|---|---|---|---|---|---|
| (A) Copper fine particles | | 0.14 | 30.79 | 45 | 45 | 45 | 45 | 100 | — |
| (B) Copper particles | EFC-09 | 1.07 | 50.10 | 50 | — | — | — | — | 100 |
| | CS-10D | 0.93 | 43.43 | — | 50 | — | — | — | — |
| | HXR-Cu | 1.48 | 41.95 | — | — | 50 | — | — | — |
| | DCX-99 | 2.76 | 57.62 | — | — | — | 50 | — | — |
| (C) Solvent | | 2-ethyl-1,3-hexanediol | | 11 | 11 | 11 | 11 | 8 | 14 |
| (D) Amine compound | | | | 1 | 1 | 1 | 1 | 2 | 0 |
| Ratio of crystallite diameters (B)/(A) | | | | 1.63 | 1.41 | 1.36 | 1.87 | — | — |
| Evaluation items | Crack occurrence | | | Not occurred | Not occurred | Not occurred | Not occurred | Occurred | Not occcured |
| | Specific resistance value (μΩ · cm) | | | 8.0 | 9.0 | 11.5 | 7.4 | Not measurable | 139.4 |
| | Die shear strength (MPa) | | | 47.0 | 32.3 | 24.2 | 34.2 | Not measurable | Not measurable |

As can be seen from the results shown in Table 1, the conductive bodies obtained by firing the conductive pastes of Examples 1-4 were free of cracks, had low specific resistance, and had high die shear strength. More precisely, as "crystallite diameter of (B) copper particles"/"crystallite diameter of (A) copper fine particles" became larger, the specific resistance value became smaller. It can also be seen that the die shear strength decreases as the "crystallite diameter of (B) copper particles"/"crystallite diameter of (A) copper particles" approaches 1.0 or 2.0, with the maximum at 1.6. In contrast, the conductive body obtained by firing the conductive paste of Comparative Example 1 showed cracks, and it was not possible to prepare a test piece sufficient for measuring the specific resistance and die shear strength. The conductive body obtained by firing the conductive paste of Comparative Example 2 did not have crack, but the conductive body was brittle and the die shear strength could not be measured. In addition, the specific resistance value was high.

The disclosure of Japanese Patent Application No. 2018-183879 (filing date: Sep. 28, 2018) is incorporated herein by reference in its entirety.

All references, patent applications, and technical standards described herein are incorporated herein by reference to the same extent as if the individual references, patent applications, and technical standards were specifically and individually noted as being incorporated by reference.

The invention claimed is:

1. A conductive paste comprising:
   (A) copper fine particles having an average particle diameter of 50 nm to 400 nm and a crystallite diameter of 20 nm to 40 nm;
   (B) copper particles having an average particle diameter of 0.8 μm to 5 μm and a ratio of a crystallite diameter to the crystallite diameter of the (A) copper fine particles of 1.0 to 2.0;
   (C) a solvent; and
   (D) an amine compound,
   wherein the (D) amine compound is represented by formula: $NHR_1R_4$,
   wherein $R_1$ represents a linear or branched alkyl group with 2-4 carbons substituted with one substituent selected from the group consisting of a methoxy group, an ethoxy group, and an amino group, and
   wherein $R_4$ represents hydrogen or an alkyl group with 1-3 carbon atoms that may be substituted with an amino group.

2. The conductive paste according to claim 1, wherein the (B) copper particles have an aspect ratio of 1.0 to 2.0.

3. The conductive paste according to claim 1, wherein a content of the (B) copper particles is 20 parts by mass to 80 parts by mass based on a total 100 parts by mass of the (A) copper fine particles and the (B) copper particles.

4. A die attach agent comprising the conductive paste according to claim 1.

5. A semiconductor device fabricated using the die attach agent according to claim 4.

6. The semiconductor device according to claim 5, wherein a surface to which the die attach agent is applied is copper.

7. The conductive paste according to claim 1, wherein a content of the (C) solvent is 3 parts by mass to 60 parts by mass based on a total 100 parts by mass of the (A) copper fine particles and the (B) copper particles.

8. The conductive paste according to claim 1, wherein the (D) amine compound is 3-methoxypropylamine or 3-ethoxypropylamine.

9. The conductive paste according to claim 1, wherein the (D) amine compound is 3-methoxypropylamine.

* * * * *